(12) United States Patent
Nohara et al.

(10) Patent No.: US 12,074,570 B2
(45) Date of Patent: Aug. 27, 2024

(54) OSCILLATION CIRCUIT AND ELECTRONIC DEVICE

(71) Applicants: PIEZO STUDIO INC., Miyagi (JP); INTER-UNIVERSITY RESEARCH INSTITUTE CORPORATION HIGH ENERGY ACCELERATOR RESEARCH ORGANIZATION, Ibaraki (JP)

(72) Inventors: Masaya Nohara, Ibaraki (JP); Noritoshi Kimura, Miyagi (JP)

(73) Assignees: PIEZO STUDIO INC., Miyagi (JP); INTER-UNIVERSITY RESEARCH INSTITUTE CORPORATION HIGH ACCELERATOR RESEARCH ORGANIZATION, Ibaraki (JP)

( * ) Notice: Subject to any disclaimer, the term of this patent is extended or adjusted under 35 U.S.C. 154(b) by 0 days.

(21) Appl. No.: 18/006,122

(22) PCT Filed: May 7, 2021

(86) PCT No.: PCT/JP2021/017498
§ 371 (c)(1),
(2) Date: Jan. 19, 2023

(87) PCT Pub. No.: WO2022/018930
PCT Pub. Date: Jan. 27, 2022

(65) Prior Publication Data
US 2023/0291355 A1 Sep. 14, 2023

(30) Foreign Application Priority Data
Jul. 22, 2020 (JP) .................................. 2020-125663

(51) Int. Cl.
*H03B 5/36* (2006.01)
*H03B 5/06* (2006.01)

(52) U.S. Cl.
CPC ............... *H03B 5/364* (2013.01); *H03B 5/06* (2013.01); *H03B 2200/0012* (2013.01); *H03B 2200/0082* (2013.01); *H03B 2200/009* (2013.01)

(58) Field of Classification Search
CPC ............ H03B 5/364; H03B 2200/0012; H03B 2200/0082; H03B 2200/009; H03B 5/06
(Continued)

(56) References Cited

U.S. PATENT DOCUMENTS

| 6,160,457 | A | 12/2000 | Wu | |
|---|---|---|---|---|
| 2003/0025567 | A1* | 2/2003 | Kubo | H03B 5/368 331/158 |
| 2004/0251979 | A1* | 12/2004 | Pan | H03B 5/06 331/158 |

(Continued)

FOREIGN PATENT DOCUMENTS

| JP | 55-053906 A | 4/1980 |
|---|---|---|
| JP | 3409061 B2 | 5/2003 |

(Continued)

OTHER PUBLICATIONS

International Preliminary Report on Patentability received for PCT Patent Application No. PCT/JP2021/017498, mailed on Feb. 2, 2023, 9 pages (6 pages of English Translation and 3 pages of Original Document).

(Continued)

*Primary Examiner* — Arnold M Kinkead
(74) *Attorney, Agent, or Firm* — WOMBLE BOND DICKINSON (US) LLP

(57) ABSTRACT

An oscillation circuit includes an oscillator, first and second capacitors connected between two terminals of the oscillator, and an amplification circuit having an input terminal connected to a connecting point between the oscillator and the first capacitor and an output terminal connected to a connecting point between the first capacitor and the second (Continued)

capacitor. The amplification circuit includes a first n-type transistor and a first p-type transistor respectively having source terminals, the connecting point of which is connected to the output terminal of the amplification circuit, a second p-type transistor connected to a gate terminal of the first n-type transistor, and a second n-type transistor connected to a gate terminal of the first p-type transistor.

3 Claims, 5 Drawing Sheets

(58) Field of Classification Search
USPC .......................................... 331/158, 116 FE
See application file for complete search history.

(56) References Cited

U.S. PATENT DOCUMENTS

| | | |
|---|---|---|
| 2009/0121752 A1 | 5/2009 | Lin |
| 2011/0241791 A1 | 10/2011 | Hung |

FOREIGN PATENT DOCUMENTS

| | | |
|---|---|---|
| JP | 2004-328257 A | 11/2004 |
| JP | 2005-086664 A | 3/2005 |
| JP | 2005-244546 A | 9/2005 |
| TW | 200921617 A | 5/2009 |
| TW | 201134102 A | 10/2011 |
| WO | 2013/035346 A1 | 3/2013 |

OTHER PUBLICATIONS

International Search Report and Written Opinion received for PCT Patent Application No. PCT/JP2021/017498, mailed on Jun. 22, 2021, 12 pages (6 pages of English Translation and 6 pages of Original Document Only).

Notice of Reasons for Refusal received for Japanese Patent Application No. 2020-125663, mailed on Jun. 15, 2021, 5 pages (2 pages of English Translation and 3 pages of Original Document).

* cited by examiner

OSCILLATION CIRCUIT AND ELECTRONIC DEVICE

PATENT LITERATURE

Patent Literature 1: Japanese Patent No. 3409061
Patent Literature 2: Japanese Patent Laid-Open No. 2004-328257
Patent Literature 3: International Publication No. 2013/035346

DISCLOSURE OF INVENTION

Problem to be Solved by the Invention

The present invention has been made to solve the above problems, and has as its object to provide an oscillation circuit that can implement low power consumption and high-speed oscillation activation.

Means of Solution to the Problem

An oscillation circuit according to the present invention includes a power supply terminal, a ground terminal, an oscillator, and an amplification circuit including a first capacitor and a second capacitor series-connected between two terminals of the oscillator, an input terminal connected to the oscillator and the first capacitor, an output terminal connected to the first capacitor and the second capacitor, a first n-type transistor having a source terminal connected to the output terminal, a drain terminal connected to a first switch connected to the power supply terminal, and a gate terminal connected to the input terminal, a first p-type transistor having a source terminal connected to the output terminal, a drain terminal connected to a second switch connected to the ground terminal, and a gate terminal connected to the input terminal, a second p-type transistor having a source terminal connected to the power supply terminal, a drain terminal connected to the input terminal and the gate terminal of the first n-type transistor, and a second n-type transistor having a source terminal connected to the ground terminal and a drain terminal connected to the input terminal and the gate terminal of the first p-type transistor.

In the above arrangement example of the oscillation circuit according to the present invention, the first switch connects the power supply terminal and the drain terminal of the first n-type transistor at the time of an oscillation operation, and disconnects the power supply terminal and the drain terminal of the first n-type transistor at the time of an oscillation stop, the second switch connects the ground terminal and the drain terminal of the first p-type transistor at the time of the oscillation operation, and disconnects the ground terminal and the drain terminal of the first p-type transistor at the time of the oscillation stop, the gate terminal of the second p-type transistor is controlled to be turned off at the time of the oscillation operation and to be turned on at the time of the oscillation stop, and the gate terminal of the second n-type transistor is controlled to be turned off at the time of the oscillation operation and to be turned on at the time of the oscillation stop.

An electronic device according to the present invention includes the above-described oscillation circuit.

Effect of the Invention

According to the present invention, the gate terminal of the first n-type transistor of the amplification circuit is connected to a power supply voltage, when the second p-type transistor is ON, to feed back an output voltage of the amplification circuit to the gate terminal of the first n-type transistor via the first capacitor and a third capacitor, and the gate terminal of the first p-type transistor of the amplification circuit is connected to ground, when the second n-type transistor is ON, to feed back the output voltage of the amplification circuit to the gate terminal of the first p-type transistor via the first capacitor and a fourth capacitor, thereby making it possible to implement low power consumption and high-speed oscillation activation.

BEST MODE FOR CARRYING OUT THE INVENTION

Figure 1:
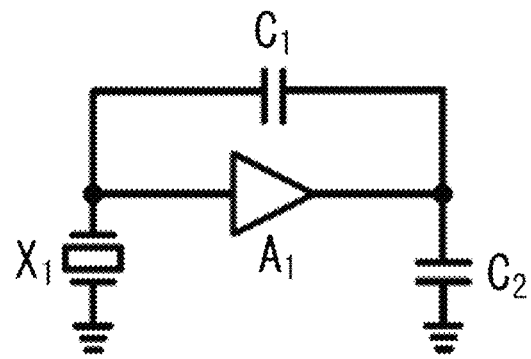
FIG. 1 is a circuit diagram showing the arrangement of a conventional Colpitts oscillation circuit.

An embodiment of the present invention will be described below with reference to the accompanying drawings. First, FIG. 1 shows the arrangement of a Colpitts oscillation circuit based on which an oscillation circuit according to this embodiment is obtained. The Colpitts oscillation circuit includes an oscillator $X_1$, an amplification circuit $A_1$, and two capacitors $C_1$ and $C_2$.

<Arrangement of Oscillation Circuit>

Figure 2:
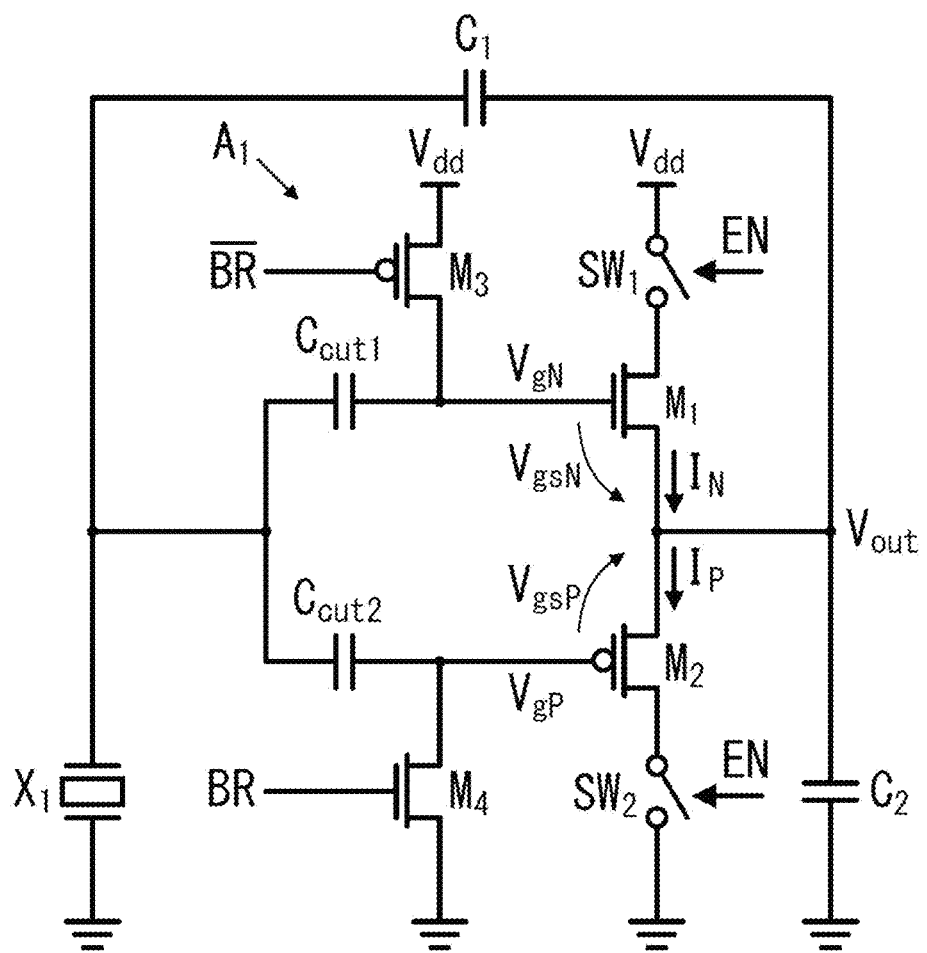
FIG. 2 is a circuit diagram showing the arrangement of an oscillation circuit according to an embodiment of the present invention.

Based on the Colpitts oscillation circuit, FIG. 2 shows the oscillation circuit of this embodiment in which the power consumption of an amplifier is reduced. The oscillation circuit of this embodiment includes a power supply terminal (not shown), a ground terminal (not shown), an oscillator $X_1$, capacitors $C_1$ and $C_2$ series-connected between two terminals of the oscillator $X_1$, and an amplification circuit $A_1$ that has an input terminal connected to the connecting point between the oscillator $X_1$ and the capacitor $C_1$ and an output terminal connected to the connecting point between the capacitors $C_1$ and $C_2$. Note that the power supply terminal is a terminal connected to the high-potential side (for example, $V_{dd}$) of a power supply voltage, and the ground terminal is a terminal connected to the low-potential side (for example, earth potential or $V_{ss}$) of the power supply voltage.

The amplification circuit $A_1$ includes an NMOS transistor (n-type transistor) $M_1$ having a source terminal connected to the output terminal of the amplification circuit $A_1$, a PMOS transistor (p-type transistor) $M_2$ having a source terminal connected to the output terminal of the amplification circuit $A_1$, a PMOS transistor $M_3$ having a gate terminal to which a bias reset signal $\overline{BR}$ is input, a drain terminal connected to the gate terminal of the NMOS transistor $M_1$, and a source terminal connected to the power supply voltage $V_{dd}$, an NMOS transistor $M_4$ having a gate terminal to which a bias reset signal BR is input, a drain terminal connected to the gate terminal of the PMOS transistor $M_2$, and a source terminal connected to ground, a capacitor $C_{cut1}$ having one terminal connected to the input terminal of the amplification circuit $A_1$ and the other terminal connected to the gate terminal of the NMOS transistor $M_1$, a capacitor $C_{cut2}$ having one terminal connected to the input terminal of the amplification circuit $A_1$ and the other terminal connected to the gate terminal of the PMOS transistor $M_2$, a switch $SW_1$ that disconnects the power supply voltage $V_{dd}$ and the drain terminal of the NMOS transistor $M_1$ at the time of an oscillation stop and connects the power supply voltage $V_{dd}$ and the drain terminal of the NMOS transistor $M_1$ at the time of an oscillation operation, and a switch $SW_2$ that disconnects ground and the drain terminal of the PMOS transistor $M_2$ at the time of the oscillation stop and connects ground and the drain terminal of the PMOS transistor $M_2$ at the time of the oscillation operation.

The capacitor $C_{cut1}$ is connected between the input terminal of the amplification circuit and the gate terminal of the NMOS transistor $M_1$ and the drain terminal of the PMOS transistor $M_3$. The capacitor $C_{cut2}$ is connected between the input terminal of the amplification circuit and the gate terminal of the PMOS transistor $M_2$ and the drain terminal of the NMOS transistor $M_4$. The capacitors $C_{cut1}$ and $C_{cut2}$ function as circuit parts that remove noise such as DC components. As the n-type transistors ($M_1$ and $M_4$) and the p-type transistors ($M_2$ and $M_3$), CMOS transistors may be used.

In the specification and claims of the present application, a case in which it is apparently described that "A and B are connected" includes a case in which A and B are electrically connected, a case in which A and B are functionally connected, and a case in which A and B are directly connected. In this case, A and B are target objects (for example, a device, an element, a circuit, a wiring, an electrode, a terminal, a conductive film, a layer, and the like). Therefore, a predetermined connection relationship is not limited to, for example, a connection relationship shown in a diagram or expressed in words, and includes a connection relationship other than the connection relationship shown in the diagram or expressed in words.

As a case in which A and B are electrically connected, for example, one or more elements (for example, a switch, a transistor, a capacitive element, an inductor, a resistive element, a diode, and the like) that can electrically connect A and B may be connected between A and B.

If an n-type or p-type transistor is used as a switch, the switch includes an input terminal (one of a source terminal and a drain terminal), an output terminal (one of the source terminal and the drain terminal), and a terminal (gate terminal) for controlling conduction. By applying a positive or negative voltage to the gate terminal, the transistor can control a current flowing from the input terminal to the output terminal, thereby functioning as a switch. If the switch is turned on, the two terminals of the switch are connected. On the other hand, if the switch is turned off, the two terminals of the switch are disconnected.

The NMOS transistor $M_1$ and the PMOS transistor $M_2$ form a cascode-connected complementary pair. The gate terminal of the NMOS transistor $M_1$ is connected to the power supply voltage $V_{dd}$ when the PMOS transistor $M_3$ is turned on, and is fed back with the output voltage of the amplification circuit $A_1$ via the capacitors $C_1$ and $C_{cut1}$. The gate terminal of the PMOS transistor $M_2$ is connected to ground when the NMOS transistor $M_4$ is turned on, and is fed back with the output voltage of the amplification circuit $A_1$ via the capacitors $C_1$ and $C_{cut2}$.

<Operation of Oscillation Circuit>

The bias reset signals $\overline{BR}$ and BR respectively input to the gate terminals of the PMOS transistor $M_3$ and the NMOS transistor $M_4$, and an oscillation permission signal EN for controlling the switches $SW_1$ and $SW_2$ can be implemented by providing, in or outside the oscillation circuit, a control circuit (not shown) that controls the start and stop operations of oscillation and an oscillation operation.

Since high transconductance gm is required to activate oscillation, the bias reset signal BR is at high at the time of the oscillation stop and the bias reset signal $\overline{BR}$ is at low at the time of the oscillation stop. Therefore, the PMOS transistor $M_3$ and the NMOS transistor $M_4$ are turned on and the NMOS transistor $M_1$ and the PMOS transistor $M_2$ are turned on.

Furthermore, at the time of the oscillation stop, the oscillation permission signal EN is set at low, and the switches $SW_1$ and $SW_2$ are turned off. As the switches $SW_1$ and $SW_2$, for example, NMOS transistors can be used. The oscillation permission signal EN is input to the gate terminal of the NMOS transistor serving as the switch $SW_1$ to connect the drain terminal to the power supply voltage $V_{dd}$ and connect the source terminal to the drain terminal of the NMOS transistor $M_1$. The oscillation permission signal EN is input to the gate terminal of the NMOS transistor serving as the switch $SW_2$ to connect the drain terminal to the drain terminal of the PMOS transistor $M_2$ and connect the source terminal to ground.

Figure 3A:
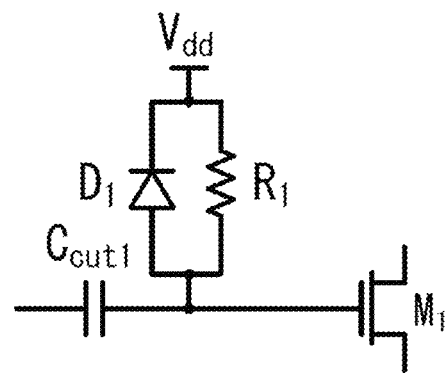
FIG. 3 shows equivalent circuit diagrams of a PMOS transistor and an NMOS transistor for bias in the oscillation circuit when the transistors are OFF according to the embodiment of the present invention.
Figure 3B:
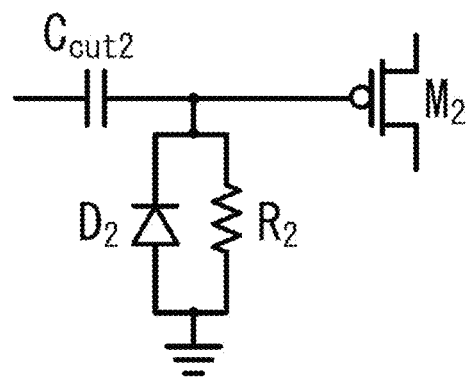

On the other hand, at the time of the oscillation operation, the bias reset signal BR is set at low and the bias reset signal $\overline{BR}$ is set at high. Therefore, the PMOS transistor $M_3$ and the NMOS transistor $M_4$ are turned off. In the OFF state, the PMOS transistor $M_3$ is represented by an equivalent circuit formed from a diode $D_1$ and a resistor $R_1$, as shown in (A) of FIG. 3. The NMOS transistor $M_4$ is represented by an equivalent circuit formed from a diode $D_2$ and a resistor $R_2$, as shown in (B) of FIG. 3.

That is, if the PMOS transistor $M_3$ is in the OFF state, a gate voltage $V_{gN}$ of the NMOS transistor $M_1$ is biased by a voltage caused by the leakage current of the diode $D_1$. Similarly, if the NMOS transistor $M_4$ is in the OFF state, a gate voltage $V_{gP}$ of the PMOS transistor $M_2$ is biased by a voltage caused by the leakage current of the diode $D_2$. The resistor $R_1$ indicates a resistance component through which the leakage current of the diode $D_1$ flows, and the resistor $R_2$ indicates a resistance component through which the leakage current of the diode $D_2$ flows.

By exemplifying the PMOS transistor $M_3$, the leakage current of the diode $D_1$ always operates to raise the gate voltage $V_{gN}$ of the NMOS transistor $M_1$ and maintain oscillation. If oscillation starts by a large signal, the gate terminal of the NMOS transistor $M_1$ is dynamically biased by feedback from the output of the amplification circuit $A_1$ via the capacitors $C_1$ and $C_{cut1}$. However, the gate voltage $V_{gN}$ of the NMOS transistor $M_1$ is clamped, by the diode $D_1$, at a voltage value whose highest value is $V_{th3}+V_{dd}$ ($V_{th3}$ is the threshold voltage of the PMOS transistor $M_3$). Similarly, the gate voltage $V_{gP}$ of the PMOS transistor $M_2$ is clamped, by the diode $D_2$, at a voltage value whose lowest value is $-V_{th4}$ ($V_{th4}$ is the threshold voltage of the NMOS transistor $M_4$).

Figure 4:
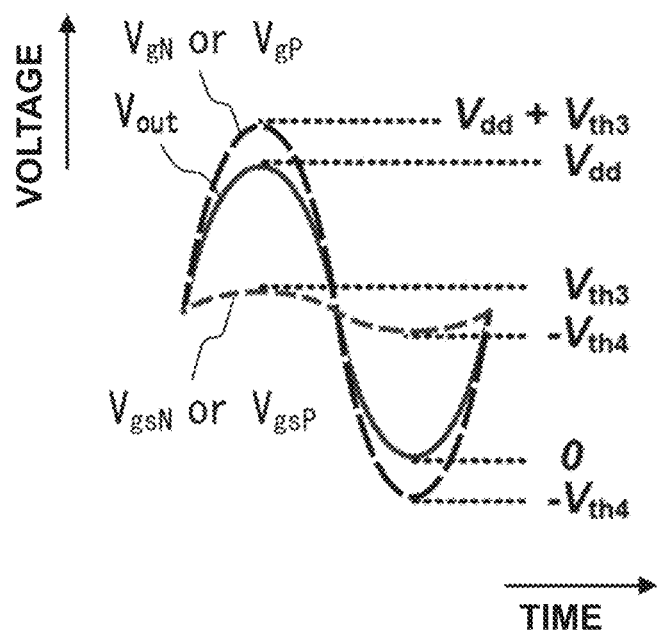
FIG. 4 is a timing chart showing the variation range of an output voltage of the oscillation circuit, and the variation ranges of the gate voltages and gate-source voltages of the PMOS transistor and NMOS transistor for bias according to the embodiment of the present invention.

FIG. 4 shows the variation ranges of an output voltage $V_{out}$ of the oscillation circuit (amplification circuit $A_1$), the gate voltage $V_{gN}$ of the NMOS transistor $M_1$, the gate voltage $V_{gP}$ of the PMOS transistor $M_2$, a gate-source voltage $V_{gsN}$ of the NMOS transistor $M_1$, and a gate-source voltage $V_{gsP}$ of the PMOS transistor $M_2$ at the time of the oscillation operation.

Furthermore, at the time of the oscillation operation, the oscillation permission signal EN is set at high and the switches $SW_1$ and $SW_2$ are turned on.

<Oscillation Waveform of Oscillation Circuit>

Figure 5:
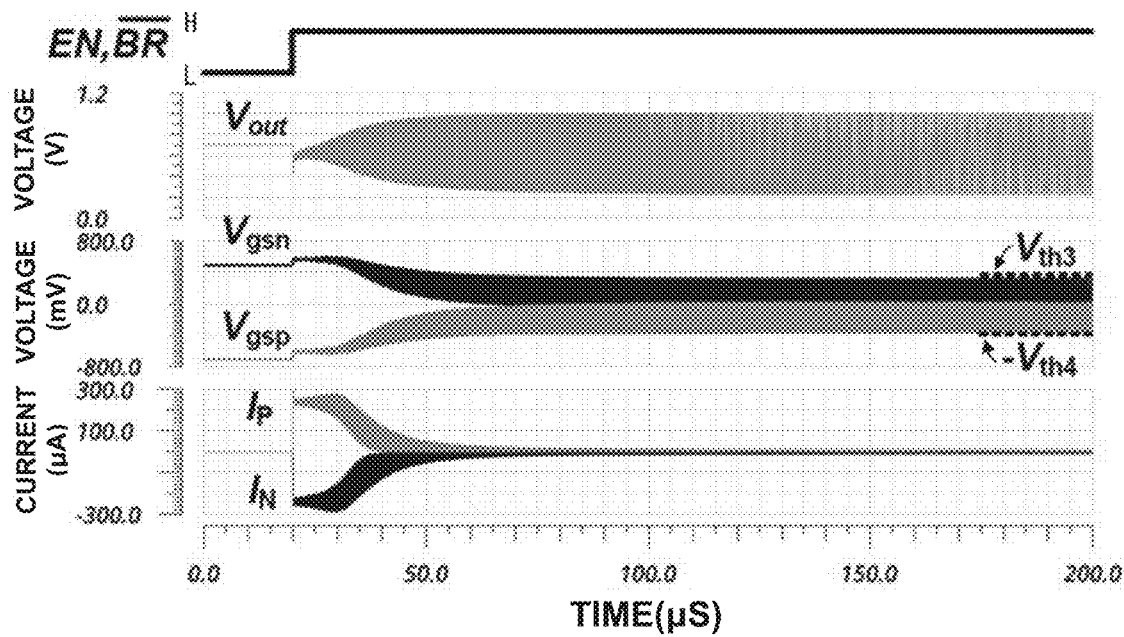
FIG. 5 is a timing chart showing an oscillation waveform after oscillation activation in the oscillation circuit according to the embodiment of the present invention.

FIG. 5 shows an oscillation waveform after oscillation activation. $I_N$ represents a source current of the NMOS transistor $M_1$, and $I_P$ represents a source current of the PMOS transistor $M_2$. It is known that the gate-source voltage $V_{gsN}$ of the NMOS transistor $M_1$ and the gate-source voltage $V_{gsP}$ of the PMOS transistor $M_2$ start from a relatively high voltage at the time of oscillation activation (when the bias reset signal $\overline{BR}$ and the oscillation permission signal EN are set at high), and then falls within the voltage range of $-V_{th4}$ to $V_{th3}$ in an oscillation stationary state. Therefore, the current flowing through each of the NMOS transistor $M_1$ and the PMOS transistor $M_2$ is very small in the stationary state.

Figure 6:
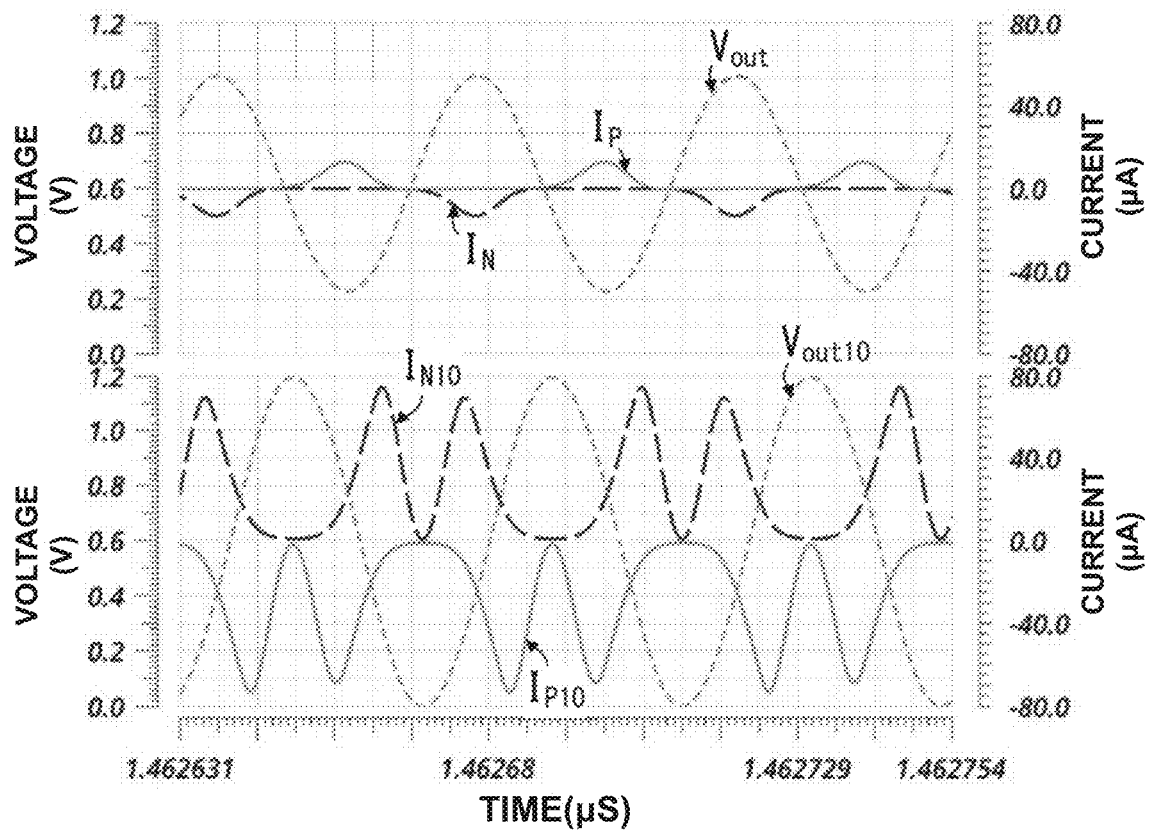
FIG. 6 is a timing chart showing the waveforms of the currents of the transistors and output voltages in the conventional Pierce oscillation circuit and the oscillation circuit according to the embodiment of the present invention.

FIG. 6 is a timing chart showing the waveforms of the output voltage $V_{out}$ of the oscillation circuit, the source current $I_N$ of the NMOS transistor $M_1$, and the source current $I_P$ of the PMOS transistor $M_2$ in the oscillation stationary state. In this example, $C_1=18$ pF and $C_2=9$ pF are set, and the capacity of a load connected to the output terminal of the oscillation circuit (amplification circuit $A_1$) is set to 6 pF.

Figure 7:
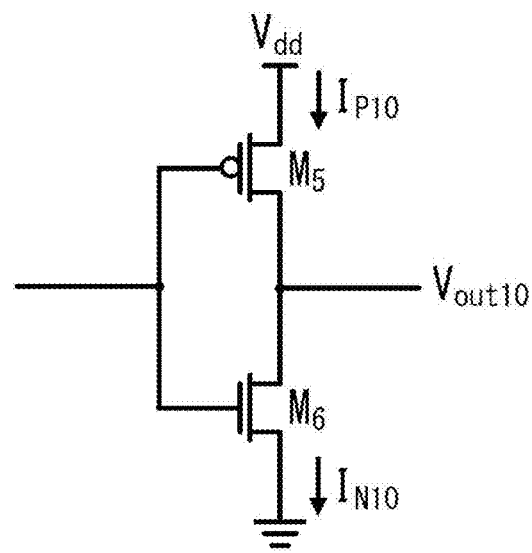
FIG. 7 is a circuit diagram showing the arrangement of an inverter of the Pierce oscillation circuit.
Figure 10:
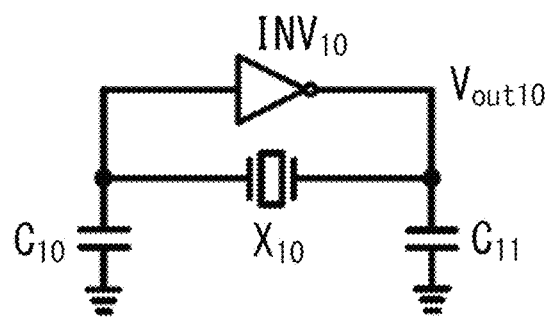
FIG. 10 is a circuit diagram showing the arrangement of the conventional Pierce oscillation circuit.

For the purpose of comparison, FIG. 6 shows an output voltage $V_{out10}$ of the Pierce oscillation circuit and currents $I_{N10}$ and $I_{P10}$ of the transistors of the inverter when the capacitors $C_1$ and $C_2$ and the capacity of a load are set to the same values as in this embodiment. The inverter $INV_{10}$ of the Pierce oscillation circuit shown in FIG. 10 includes a PMOS transistor $M_5$ and an NMOS transistor $M_6$, as shown in FIG. 7.

As is apparent from FIG. 6, as compared with the currents $I_{N10}$ and $I_{P10}$ of the Pierce oscillation circuit, the currents $I_N$ and $I_P$ of the oscillation circuit of this embodiment flow only at a timing when the output voltage $V_{out}$ becomes an extreme value, and current amounts are very small. Therefore, according to this embodiment, it is known that it is possible to largely reduce the power consumption in the oscillation state. In fact, it is known that a power consumption Pss in the stationary state of the oscillation circuit of this embodiment is as low as about 1/10 of the power consumption in the stationary state of the Pierce oscillation circuit.

<Phase Noise Characteristic of Oscillation Circuit>

Figure 8:
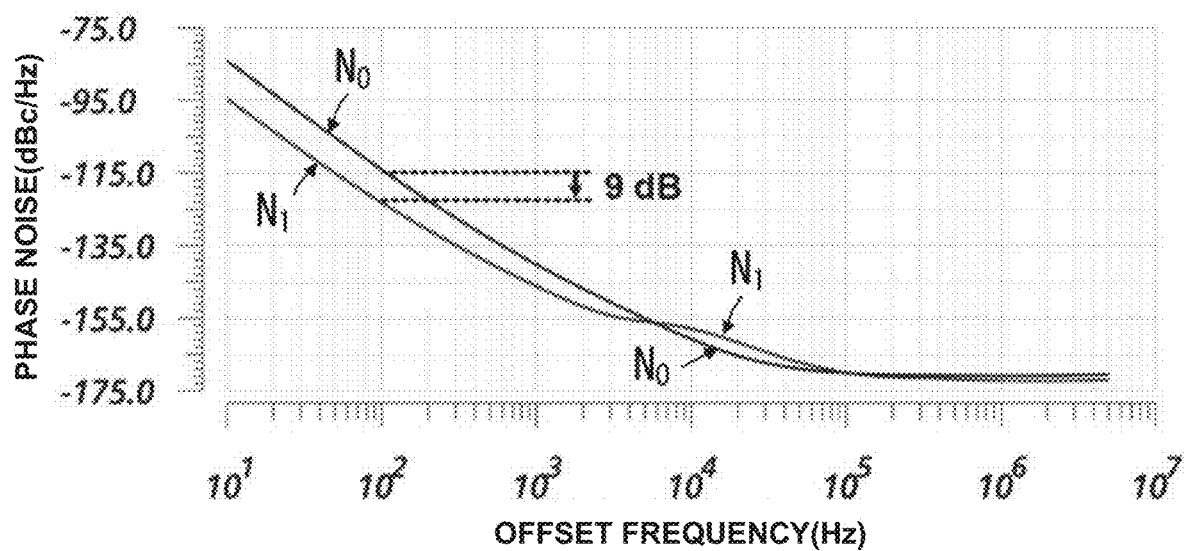
FIG. 8 is a graph showing the phase noise characteristics of the conventional Pierce oscillation circuit and the oscillation circuit according to the embodiment of the present invention.

FIG. 8 shows the phase noise characteristics of the conventional Pierce oscillation circuit and the oscillation circuit of this embodiment. In FIG. 8, $N_0$ represents the phase noise of the Pierce oscillation circuit, and $N_1$ represents the phase noise of the oscillation circuit of this embodiment. As compared with the conventional Pierce oscillation circuit, it is known that the phase noise as important oscillation circuit performance for a communication device is improved by about 9 dB within the range of the offset frequency up to 100 Hz with respect to the fundamental frequency of the oscillation circuit. As described above, it is apparent that the use of the oscillation circuit of this embodiment contributes to reduction of the phase noise of the communication device.

<Oscillator in Oscillation Circuit>

Figure 9A:
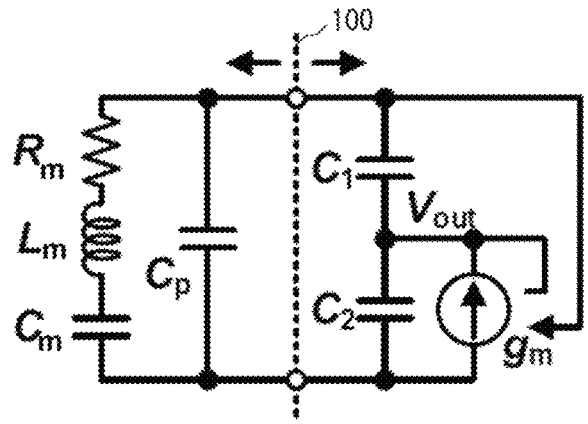
FIG. 9 shows equivalent circuit diagrams of an oscillator using langasite-type piezoelectric single crystal and a crystal oscillator.
Figure 9B:
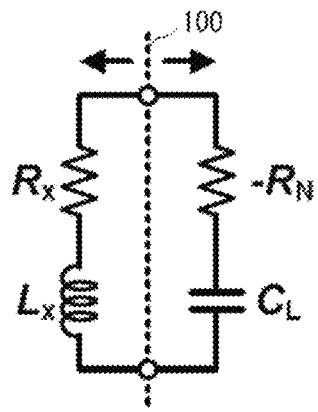

As the oscillator $X_1$ of the oscillation circuit, various oscillators such as a crystal oscillator and an oscillator using langasite-type piezoelectric single crystal can be used. To activate oscillation of the oscillation circuit at higher speed to implement lower oscillation activation energy, in this embodiment, an oscillator using langasite-type piezoelectric single crystal is used as the oscillator $X_1$. There are various langasite-type piezoelectric single crystals but an oscillator using $Ca_3TaGa_3Si_2O_{14}$ (to be referred to as CTGS) is used in an experiment. Langasite is a single crystal expressed by a chemical composition such as $Ca_3NbGa_3Si_2O_{14}$ (to be referred to as CHGS), $Ca_3Ta(Ga_{1-x}Al_x)_3Si_2O_{14}$ (to be referred to as CTGAS), or $Ca_3Nb(Ga_{1-x}Al_x)_3Si_2O_{14}$ (to be referred to as CNGAS) in addition to CTGS, and the langasite-type piezoelectric single crystal is not limited to the oscillator using CTGS. In FIG. 9, (A) and (B) show equivalent circuits of a CTGS oscillator used and the crystal oscillator (quartz) used for reference. (B) of FIG. 9 shows an equivalent circuit diagram obtained by simplifying (A) of FIG. 9. The left side of a line 100 in (A) or (B) of FIG. 9 shows the equivalent circuit of the oscillator and the right side of the line 100 shows the equivalent circuit of the oscillation circuit. Table 1 shows a capacitor $C_L$, an inductance $L_m$, a resistor $R_m$, a capacitor $C_m$, a resistor $R_x$, and a Q value.

TABLE 1

|  | CTGS | Quartz |
| --- | --- | --- |
| $C_L$ (pF) | 6 ($C_1$ = 18 pF, $C_2$ = 9 pF) | |
| $L_m$ (mH) | 1.45 | 13.2 |
| $R_m$ (Ω) | 6.2 | 16.9 |
| $C_m$ (fF) | 30 | 3.6 |
| $R_x$ (Ω) | 10.2 | 24.3 |
| Q | 35267 | 117607 |

As a result of the experiment using the CTGS oscillator as the oscillator $X_1$, an oscillation activation time Ts of the oscillation circuit of this embodiment was 0.37 ms and oscillation activation energy Es was 30 nJ. On the other hand, if the crystal oscillator was used as the oscillator $X_1$, the oscillation activation time Ts of the oscillation circuit shown in FIG. 2 was 3.6 ms and the oscillation activation energy Es was 320 nj.

Therefore, if the CTGS oscillator was used as the oscillator $X_1$, it was confirmed that, as compared with a case in which the crystal oscillator was used, it was possible to implement the oscillation activation time earlier by about one order of magnitude, and also reduce the oscillation activation energy by about one order of magnitude, thereby implementing low power consumption.

As described above, according to this embodiment, it is possible to implement high-speed oscillation activation, and implement an oscillation circuit of low power consumption in the oscillation stationary state after oscillation activation.

Therefore, if the oscillation circuit of this embodiment is applied to, for example, an electronic device such as a mobile phone or an IoT device, this can contribute to implementation of an electronic device of low power consumption.

INDUSTRIAL APPLICABILITY

The present invention is applicable to an oscillation circuit used in a small electronic device.

EXPLANATION OF THE REFERENCE NUMERALS AND SIGNS $A_1$ . . . amplification circuit, $C_1$, $C_2$, $C_{cut1}$, $C_{cut2}$ . . . capacitor, $M_1$-$M_4$ . . . transistor, $SW_1$, $SW_2$ . . . switch, $X_1$ . . . oscillator

The invention claimed is:

1. An oscillation circuit comprising:
a power supply terminal;
a ground terminal;
an oscillator; and
an amplification circuit including a first capacitor and a second capacitor series-connected between two terminals of the oscillator, an input terminal connected to the oscillator and the first capacitor, an output terminal connected to the first capacitor and the second capacitor, a first n-type transistor having a source terminal connected to the output terminal, a drain terminal connected to a first switch connected to the power supply terminal, and a gate terminal connected to the input terminal, a first p-type transistor having a source terminal connected to the output terminal, a drain terminal connected to a second switch connected to the ground terminal, and a gate terminal connected to the input terminal, a second p-type transistor having a source terminal connected to the power supply terminal, a drain terminal connected to the input terminal and the gate terminal of the first n-type transistor, and a second n-type transistor having a source terminal connected to the ground terminal and a drain terminal connected to the input terminal and the gate terminal of the first p-type transistor.

2. The oscillation circuit according to claim 1, wherein the first switch connects the power supply terminal and the drain terminal of the first n-type transistor at the time of an oscillation operation, and disconnects the power supply terminal and the drain terminal of the first n-type transistor at the time of an oscillation stop, the second switch connects the ground terminal and the drain terminal of the first p-type transistor at the time of the oscillation operation, and disconnects the ground terminal and the drain terminal of the first p-type transistor at the time of the oscillation stop, the gate terminal of the second p-type transistor is controlled to be turned off at the time of the oscillation operation and to be turned on at the time of the oscillation stop, and the gate terminal of the second n-type transistor is controlled to be turned off at the time of the oscillation operation and to be turned on at the time of the oscillation stop.

3. An electronic device comprising an oscillation circuit defined in claim 1.

* * * * *